United States Patent
Aiello et al.

(10) Patent No.: US 6,815,798 B2
(45) Date of Patent: Nov. 9, 2004

(54) INTEGRATED CAPACITOR FOR SENSING THE VOLTAGE APPLIED TO A TERMINAL OF AN INTEGRATED OR DISCRETE POWER DEVICE ON A SEMICONDUCTOR SUBSTRATE

(75) Inventors: Natale Aiello, Trecastagni (IT); Davide Patti, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/439,277

(22) Filed: May 15, 2003

(65) Prior Publication Data
US 2004/0016960 A1 Jan. 29, 2004

(30) Foreign Application Priority Data
May 15, 2002 (IT) ..................... VA2002A0034

(51) Int. Cl.[7] .......................... H01L 29/00; H01L 21/20
(52) U.S. Cl. .................. 257/532; 257/341; 438/393; 438/396
(58) Field of Search ................. 257/341, 532, 257/487, 368, 379, 577; 438/393, 396, 171, 190, 239, 329

(56) References Cited

U.S. PATENT DOCUMENTS
2004/0016960 A1 * 1/2004 Aiello et al. ............ 257/328

* cited by examiner

Primary Examiner—Mark V. Prenty
(74) Attorney, Agent, or Firm—Allen, Dyer, Doppelt, Milbrath & Gilchrist, P.C.; Lisa K. Jorgenson

(57) ABSTRACT

A capacitor for sensing a substrate voltage in an integrated circuit power device may be implemented by isolating a portion or segment of the metal layer that normally covers the heavily doped perimeter region typically used for electric field equalization. In conjunction, one or more portions of an isolation dielectric layer of silicon oxide are not removed from the surface of the semiconductor substrate, as is commonly done before depositing the metal layer. The portions of isolated silicon oxide which are not removed become the dielectric layer of the capacitor. Moreover, one plate of the capacitor is formed by the heavily doped perimeter region that is electrically connected to the substrate (e.g. a drain or collector region). The other plate is formed by the segment of metal isolated from the remaining metal layer defined directly over the heavily doped perimeter region.

27 Claims, 3 Drawing Sheets

INTEGRATED CAPACITOR FOR SENSING THE VOLTAGE APPLIED TO A TERMINAL OF AN INTEGRATED OR DISCRETE POWER DEVICE ON A SEMICONDUCTOR SUBSTRATE

FIELD OF THE INVENTION

The present invention relates to the field of semiconductor devices, and, more particularly, to semiconductor power devices. The invention is well suited for discrete power devices, as well as power devices co-integrated on the same chip with drive and control circuits, for example.

BACKGROUND OF THE INVENTION

In general, in a monolithic semiconductor power device, such as one implemented with VIPower technology, for example, a voltage divider or an equivalent element for monitoring the substrate voltage will be integrated in the sector with the low voltage control circuitry. According to one prior art approach, this function is implemented using an integrated resistor divider between the substrate and the control region. An alternative prior art approach is that the detection element is an integrated capacitor through which variations in the substrate voltage are sensed.

In such devices the substrate typically coincides with the collector terminal/drain terminal/electrode of the power transistor that in many cases (e.g., VIPower, power integrated circuit (PIC), etc.) is connected to the external circuit through a bottom or back metal layer of the substrate. Relatively high voltages may be applied to the substrate (e.g., up to 2000 V), and thus any integrated resistor divider or integrated capacitor used for sensing the substrate voltage will need to withstand such voltages.

If a capacitor is used for sensing voltage variations, the capacitor is commonly implemented via a p/n junction. Yet, this approach has drawbacks such as, for example, that the capacitance value varies significantly with the applied voltage. In particular, for relatively high (i.e., >100 V) voltages the capacitance tends to decrease to very small values, thus making detection of voltage variations thereon very difficult.

This problem, which is typical of integrated junction capacitors, may be addressed by using a dielectric-type capacitor. Of course, the thickness and electrical characteristics of the dielectric material should be adequate to withstand the intense electric field that may be present between the capacitor plates, and at the highest rated voltage. Silicon oxide, deposited or grown according to common semiconductor device fabrication techniques, is an excellent dielectric that may be used even with a relatively large thickness (around 1–2 $\mu$m) without significant fabrication difficulties.

Nevertheless, using a relatively thick dielectric significantly limits the capacitance that may be obtained per unit area according to the known physical law ($C=\epsilon_0 \cdot \epsilon_r \cdot A/d$) where d is the thickness of the dielectric and A is the area of the capacitor. Thus, to have capacitors of sufficiently large capacitance for sensing of substrate voltage variations, even at very low frequencies a relatively large integration area is required. Yet, this represents a significant burden. As such, designers tend to favor less area consuming alternatives to dielectric-type summing capacitors.

SUMMARY OF THE INVENTION

An object of the present invention is to provide for the integration of a high voltage dielectric-type capacitor for sensing the substrate voltage in monolithic power devices without undue silicon area consumption.

Generally speaking, the present invention provides this and other features by utilizing the edge or perimeter structure common to many monolithic semiconductor power devices for implementing a capacitor for sensing substrate voltage. More particularly, as is well known to those skilled in the art, in many semiconductor power devices (whether integrated or discrete) there is typically a perimeter or edge diffusion region. This perimeter region is generally ten or more micrometers wide, and more particularly about 20–50 $\mu$m wide, and it surrounds the area where the power device is integrated.

The perimeter region is also spaced a uniform distance from the integration area, typically several tens of $\mu$m, and more particularly about 50 to 150 $\mu$m therefrom. Moreover, the perimeter region is usually heavily doped with a dopant of the same type of conductivity of the substrate and electrically connected thereto. The purpose of the perimeter region is to make the electric field around the device as uniform as possible, thus the heavy doping to make it highly conducting.

A continuous metal layer is often deposited and defined directly in contact with the doped silicon of the edge region. This is done to make the edge region even more conductive for a collector or drain that surrounds the area occupied by the power device, and also potentially for the drive and control circuitry of the power device. In practice, since the edge region is so highly conductive and in electric contact with the semiconductor substrate, it may be considered an extension of the collector electrode that is commonly represented by the metallization layer of the back or bottom of the semiconductor chip.

It has been found that a capacitor for sensing the substrate voltage may be efficiently and economically implemented by isolating a portion or segment of the metal layer that normally covers this heavily doped edge region of electric field equalization. Moreover, an isolation dielectric layer of silicon oxide is not removed from the surface of this semiconductor substrate, as is normally done on the remaining portion of the perimeter region, before depositing the metal. This remaining layer of isolated silicon oxide becomes the dielectric layer of the capacitor.

The plates of the capacitor are the heavily doped perimeter region that is electrically connected to the substrate (i.e., drain or collector region), and the segment of metal that is isolated from the remaining metal layer and defined directly over the heavily doped edge region. Through successive process steps a conducting path may be defined from the second plate to a relative voltage sensing node of the circuit for monitoring the substrate voltage.

In addition to having a relatively negligible integration area requirement, such a substrate voltage sensing capacitor is a dielectric-type capacitor. As such, it is not subject to capacitance changes due to variations of the applied voltage. Moreover, the relatively large thickness of the layer of isolation oxide (commonly above 1 $\mu$m) that is normally deposited over the perimeter region is quite capable of withstanding the rated voltage (i.e., up to or even above 2000 V).

DETAILED DESCRIPTION OF THE PREFERRED EMBODIMENTS

Figure 1:
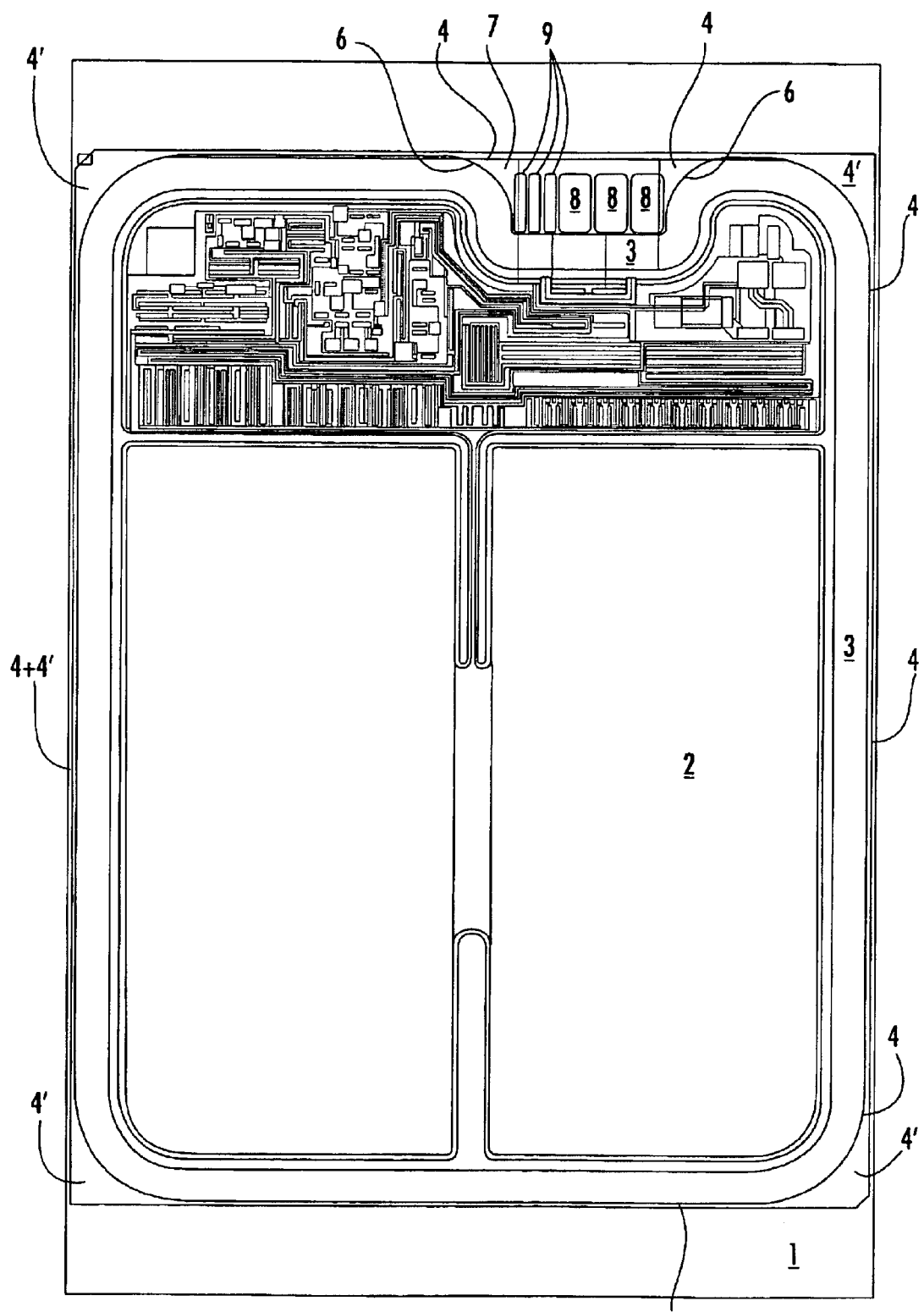
FIG. 1 is a top plan view illustrating the layout of a semiconductor device in accordance with the present invention.
Figure 2:
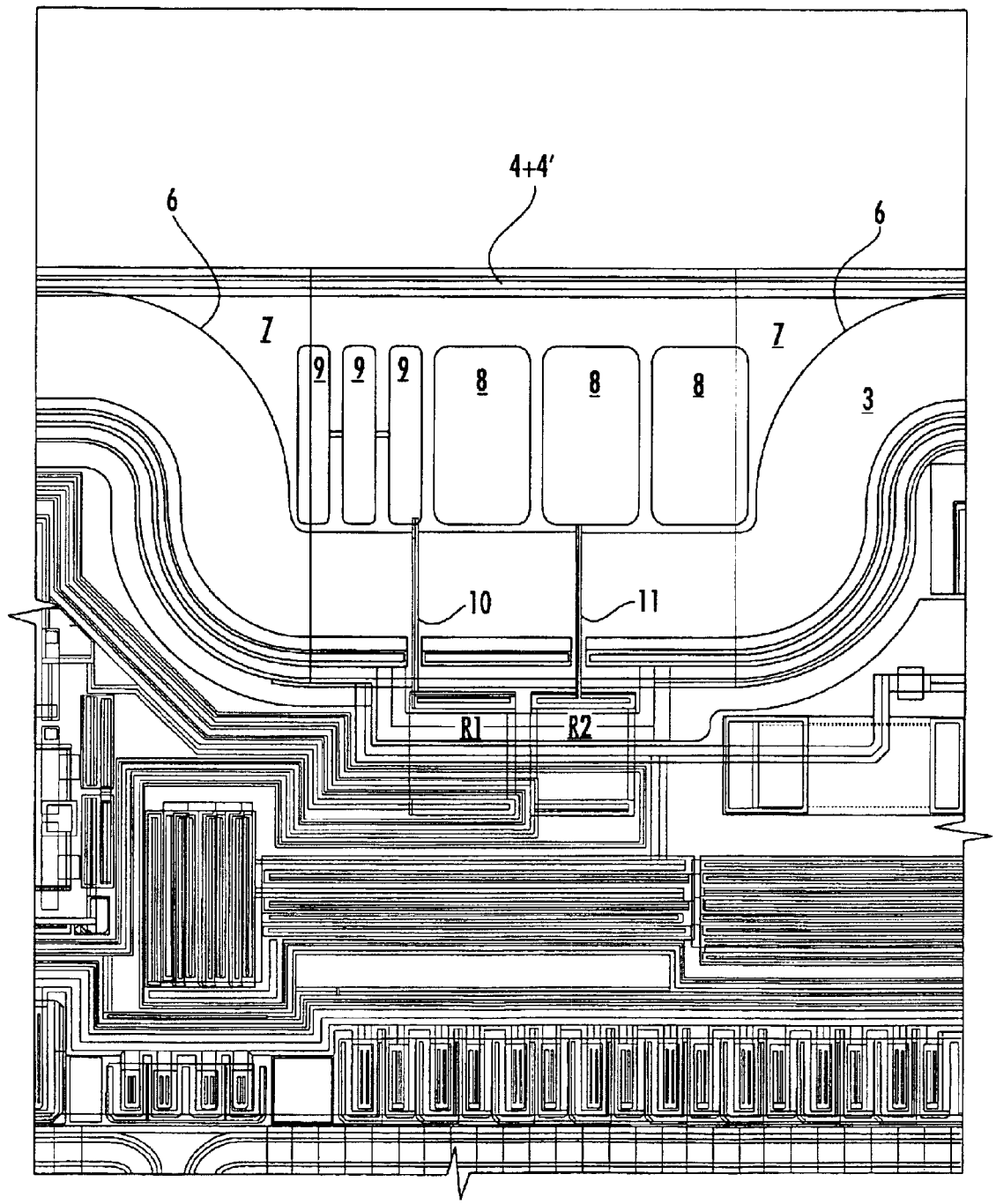
FIG. 2 is a top plan view illustrating in greater detail one portion of the semiconductor device layout of FIG. 1.

Referring initially to FIGS. 1 and 2, a silicon chip 1 in accordance with the invention is first described. In particular, included on the semiconductor chip 1 is a test power device 2 (i.e., transistor) which was used for defining appropriate capacitor dimensions for sensing voltage variations of a collector (or drain) of the power transistor. More particularly, the illustrated power transistor 2 is a generic device whose collector or drain electrode, in the case of a VIPower® device from STMicroelectronics, assignee of the present application, is formed by a bottom or back metal layer of the chip 1.

As will be noticed from the full view of the device layout illustrated in FIG. 1, on the right of the layout is the drive and control circuitry of the power transistor 2. Further, a perimeter separation area 3 has a width typically between 50 and 150 μm (in the illustrated device it is about 150 μm), that completely surrounds the area of the power device 2 and the control and drive circuitry.

The perimeter region 3 separates the silicon integrated structures from a heavily doped perimeter edge-diffused region 4, which is electrically connected with, and thus at the same potential as, the substrate. In the illustrated embodiment the width of this perimeter region 4 is about 30 μm. As noted above, to increase the compounded electric conductivity of this heavily doped perimeter region 4, which is for equalizing the electric field along the border of the integrated circuit device, this region is normally covered by a metal layer 4'. The metal layer 4' is formed directly on the perimeter region 4 by prior removal at the appropriate locations of the layer of isolation silicon oxide. The removal of the isolation oxide is done using a mask. The metal layer may even be defined to be slightly wider than the underlying heavily doped perimeter region 4.

To verify the effectiveness and to study the most appropriate dimensioning of the sensing capacitor according to the present invention, in the perimeter layout an enlarged area 7 was deliberately implemented by inwardly enlarging the heavily doped perimeter region 4, whose profile in this zone of enlargement is indicated by the line 6. Consequently, in conjunction with the enlargement of the perimeter region 4, the separation region 3 runs along the inner side of the enlargement following an indent line. In the area 7, the isolation oxide layer was not removed, and over this dielectric layer two groups 8 and 9 of three plates each were formed (each having different dimensions) by appropriately depositing and defining the metal layer.

The area of the larger plates 8 is about $12*10^3$ μm$^2$, while the area of the smaller plates 9 is about $4.5*10^3$ μm$^2$ in the illustrated example. The isolation silicon oxide 12 under the plates 8 and 9 was about 1.5 μm thick. A number of test devices so designed allowed various combinations of single and/or parallel connections of the plates of the two groups 8 and 9 for determining the effectiveness of different capacitance values. These values were modularly established in terms of a certain overall area of the dielectric integrated capacitor, one plate of which is formed by the underlying heavily doped perimeter diffusion 4 that is electrically connected to the substrate Sub (FIG. 3) and thus to the collector (or drain) electrode of the power device 2.

It will also be noticed from the illustrated embodiment that the metal lines 10 and 11 provide electrical connections, respectively, from a plate 9 of fractional area and a plate 8 of a larger area to integrated resistors R1 and R2, although other configurations could alternately be selected. Investigation using test devices as described above confirmed the correct functioning and effectiveness of the sensing capacitor of the invention.

Tests on different combinations of areas for the capacitor also confirmed that the required area may in practice be realized by simply isolating a segment of the metal layer 4' having an appropriate length. The metal layer 4' is normally defined over the heavily doped border diffusion 4, and may be formed by leaving intact, in the area of this segment, the dielectric isolation layer. In this way, a dielectric capacitor having an upper plate formed by an isolated segment of the perimeter metal strip segment 4' may be conventionally connected to the sensing node of the detection circuit by an appropriate metal interconnect. This provides for a rather efficient implementation without requiring any additional dedicated area.

In the area of the isolated metal segment, if necessary the width of the perimeter region 4 and of the metal layer 4' defined thereon may even be increased to best exploit the available silicon area, and thus reduce the length of the metal segment to be isolated for forming the sensing capacitor. In some embodiments the detection and control circuitry of the power transistor may not be integrated on the same chip. In such case, the isolated metal segment forming the upper plate of the sensing capacitor may coincide or be connected to a dedicated connection pad for connection to external detection and control circuitry of the power device.

The "interruption" of the continuity of the metal layer 4' is in any case relatively small compared to the whole perimeter, and it does not influence in any appreciable way the electric field equalization function that is performed by the perimeter ring structure. This structure is formed by the uninterrupted heavily doped perimeter region 4 and by the metal layer 4', which is in contact with the rest of the perimeter region except for the relatively short isolated segment.

Figure 3:
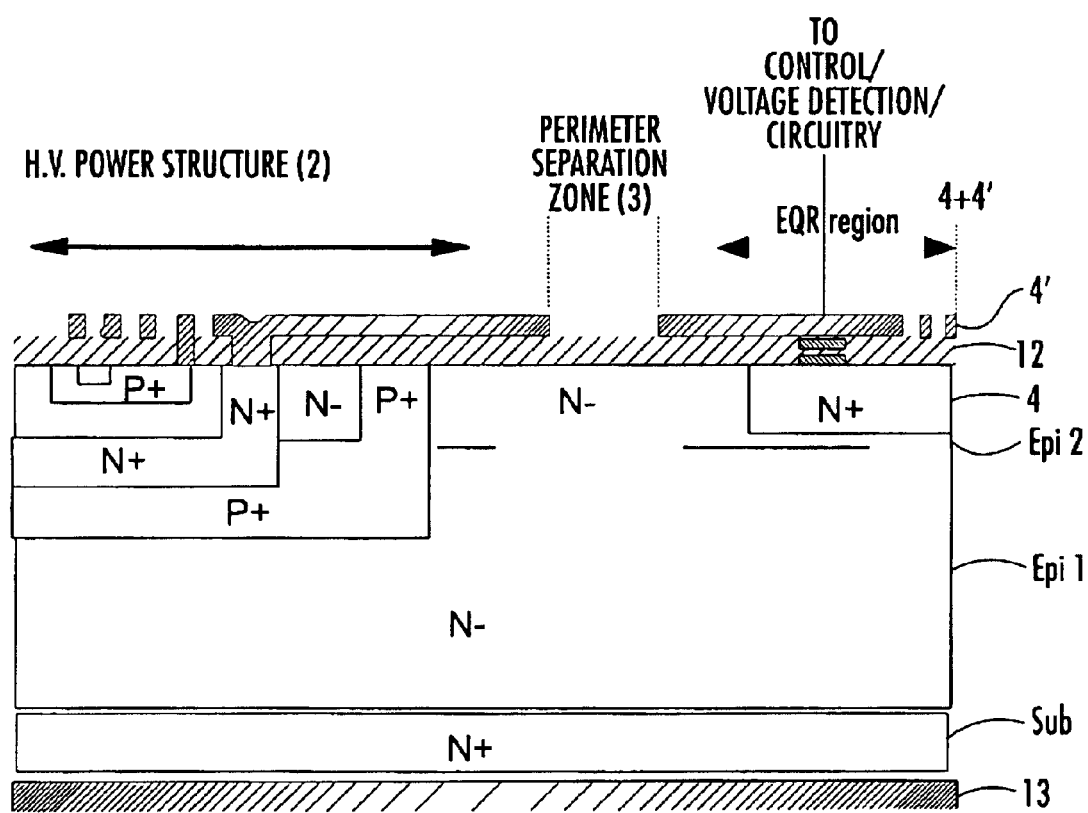
FIG. 3 is a sectional view illustrating a voltage sensing capacitor structure in accordance with the present invention.

In accordance with the invention, the typical power device fabrication process steps advantageously do not require any significant modification, as will be evident to those skilled in the art from the following description of an exemplary fabrication process now described with reference to FIG. 3. In particular, the following process refers to a generic VIPower® structure for clarity of explanation, but the present invention may also be implemented with other fabrication processes as well.

A substrate Sub has a high n+ type dopant concentration, and a first epitaxial layer Epi 1 is grown thereon. The concentration of the n-type dopant and thickness of the first epitaxial layer Epi 1 are appropriately designed as a function of the voltage class to which the device belongs, as will be appreciated by those skilled in the art. On the first epitaxial layer Epi 1 a buried p+ base region of the power transistor and a buried n+ emitter region of the power transistor are formed by ion implantations and successive diffusion treatments. These provide the necessary buried layers to build the power device.

Next, a second n− epitaxial layer Epi 2 is successively grown over the first epitaxial layer Epi 1. Two diffusions are then performed of the p+ type and n+ type, respectively, by common photolithography, ion implantation, and diffusion techniques to form deep, low resistivity contacts with the previously formed buried n+ and p+ regions of the high voltage power device.

The n+ type diffusion also occurs in the perimeter region EQR to form the heavily doped n+ perimeter region 4 for equalization of the edge electric field. The perimeter region 4 is electrically connected with the substrate Sub and, as described above, also forms the lower plate of the sensing capacitor of the invention, the electric symbol of which is illustratively shown in FIG. 3. The isolated metal segment 4' which forms the upper plate of the capacitor, the dielectric isolation layer 12 is left intact to form the dielectric of the sensing capacitor.

From this point, the sequence of steps of the fabrication process may continue according to traditional process steps. That is, the structure of the power device may be completed by forming the appropriate layers/regions, and then electric contacts and electrical interconnect lines may be created using known photolithography and/or etching techniques, as will be appreciated by those skilled in the art. Except for the isolated segment 4' of the patterned metal that forms the upper plate of the sensing capacitor, the perimeter metal layer 4' is deposited directly on, and in electrical contact with, the heavily doped n+ perimeter region 4 after removal (through masking and etching) of the isolation oxide layer 12.

In a VIPower, PIC or similar processes for fabricating integrated power devices, the sensing capacitor according to the present invention may be implemented relatively easily. This is, this may be done by modifying the mask used for defining and opening the contacts and exposing the silicon over the edge diffusion 4 (with the exception of the segment with which the sensing capacitor is formed according to the present invention) and the metal patterning mask, as will be appreciated by those skilled in the art. This is because all the layers needed for making the sensing capacitor according to the invention are already present.

That which is claimed is:

1. A semiconductor device comprising:
   a semiconductor substrate having a first conductivity type, said substrate having top and bottom surfaces;
   a first metal layer adjacent the bottom surface of said semiconductor substrate;
   a semiconductor layer adjacent the top surface of said semiconductor substrate having the first conductivity type and a dopant concentration less than said semiconductor substrate;
   a perimeter region adjacent at least some of a perimeter of said semiconductor layer, said perimeter region having the first conductivity type and a dopant concentration greater than said semiconductor layer;
   circuitry within said perimeter region;
   a contact for electrically connecting said circuitry and said first metal layer, said contact also being electrically connected to said perimeter region;
   an isolating layer comprising a dielectric material on a portion of said perimeter region; and
   a second metal layer on said perimeter region and said isolating layer;
   said second metal layer defining a sensing capacitor with said isolation layer and said perimeter region for sensing a voltage at said contact.

2. The semiconductor device of claim 1 further comprising a voltage detection circuit connected to said second metal layer for detecting the sensed voltage.

3. The semiconductor device of claim 1 wherein said circuitry comprises an integrated bipolar junction transistor (BJT).

4. The semiconductor device of claim 1 wherein said circuitry comprises an integrated field effect transistor (FET).

5. The semiconductor device of claim 1 wherein said perimeter region is diffused in said semiconductor layer.

6. The semiconductor device of claim 1 wherein said perimeter region surrounds said integrated circuit to provide electrical field equalization therefor.

7. The semiconductor device of claim 1 wherein said second metal layer has a width greater than or equal to a width of said perimeter region.

8. A semiconductor device comprising:
   a semiconductor substrate having top and bottom surfaces;
   a first conductive layer adjacent the bottom surface of said semiconductor substrate;
   a semiconductor layer adjacent the top surface of said semiconductor substrate;
   a perimeter region adjacent at least some of a perimeter of said semiconductor layer;
   a contact electrically connected to said first conductive layer and said perimeter region;
   an isolating layer comprising a dielectric material on a portion of said perimeter region; and
   a second conductive layer on said perimeter region and said isolating layer;
   said second conductive layer defining a sensing capacitor with said isolation layer and said perimeter region for sensing a voltage at said contact.

9. The semiconductor device of claim 8 further comprising a voltage detection circuit connected to said second conductive layer for detecting the sensed voltage.

10. The semiconductor device of claim 8 further circuitry within said perimeter region connected to said contact.

11. The semiconductor device of claim 10 wherein said circuitry comprises an integrated bipolar junction transistor (BJT).

12. The semiconductor device of claim 10 wherein said circuitry comprises an integrated field effect transistor (FET).

13. The semiconductor device of claim 8 wherein said perimeter region is diffused in said semiconductor layer.

14. The semiconductor device of claim 8 wherein said perimeter region surrounds said integrated circuit to provide electrical field equalization therefor.

15. The semiconductor device of claim 8 wherein said second conductive layer has a width greater than or equal to a width of said perimeter region.

16. The semiconductor device of claim 8 wherein said semiconductor substrate, said semiconductor layer, and said perimeter region have a same conductivity type; and wherein said semiconductor substrate and said perimeter region have a greater dopant concentration than said semiconductor layer.

17. The semiconductor device of claim 8 wherein said first and second conductive layers comprise metal.

18. A method for making a semiconductor device comprising:
   providing a semiconductor substrate having top and bottom surfaces;
   forming a first conductive layer adjacent the bottom surface of the semiconductor substrate;
   forming a semiconductor layer adjacent the top surface of the semiconductor substrate;
   forming a perimeter region adjacent at least some of a perimeter of the semiconductor layer;

forming a contact electrically connected to the first conductive layer and to the perimeter region;

forming an isolating layer comprising a dielectric material on a portion of the perimeter region; and forming a second conductive layer on the perimeter region and the isolating layer, the second conductive layer defining a sensing capacitor with the isolation layer and the perimeter region for sensing a voltage at the contact.

19. The method of claim 18 further comprising forming a voltage detection circuit for detecting the sensed voltage and connecting the voltage detection circuit to the second conductive layer.

20. The method of claim 18 further comprising forming circuitry within the perimeter region electrically connected to the contact.

21. The method of claim 20 wherein the circuitry comprises an integrated bipolar junction transistor (BJT).

22. The method of claim 20 wherein the circuitry comprises an integrated field effect transistor (FET).

23. The method of claim 18 wherein forming the perimeter region comprises diffusing the perimeter region in the semiconductor layer.

24. The method of claim 18 wherein forming the perimeter region comprises forming the perimeter region to surround the integrated circuit for providing electrical field equalization therefor.

25. The method of claim 18 wherein the second conductive layer has a width greater than or equal to a width of the perimeter region.

26. The method of claim 18 wherein the semiconductor substrate, the semiconductor layer, and the perimeter region have a same conductivity type; and wherein the semiconductor substrate and the perimeter region have a greater dopant concentration than the semiconductor layer.

27. The method of claim 18 wherein the first and second conductive layers comprise metal.

* * * * *